(12) United States Patent
Vimercati et al.

(10) Patent No.: US 7,515,464 B2
(45) Date of Patent: Apr. 7, 2009

(54) SYNCHRONIZATION OF OPERATIONS IN DISTINCT MEMORY PARTITIONS

(76) Inventors: Daniele Vimercati, Via M. L. King, 10, 20048 Carate Brianza (IT); Andrea Martinelli, Via XXIV Maggio, 24025 Gazzaniga (IT); Efrem Bolandrina, Via Cedrali, 5, 24020 Fiorano al Serio (IT)

( * ) Notice: Subject to any disclaimer, the term of this patent is extended or adjusted under 35 U.S.C. 154(b) by 40 days.

(21) Appl. No.: 11/686,133

(22) Filed: Mar. 14, 2007

(65) Prior Publication Data

US 2007/0217257 A1    Sep. 20, 2007

(30) Foreign Application Priority Data

Mar. 14, 2006    (IT) .................. VA2006A000014

(51) Int. Cl.
*G11C 11/34* (2006.01)
(52) U.S. Cl. ...................... 365/185.02; 365/185.22
(58) Field of Classification Search ............ 365/185.02, 365/185.22, 185.21
See application file for complete search history.

(56) References Cited

U.S. PATENT DOCUMENTS

| | | | | | |
|---|---|---|---|---|---|
| 5,835,414 | A | * | 11/1998 | Hung et al. | 365/185.25 |
| 6,147,910 | A | * | 11/2000 | Hsu et al. | 365/185.25 |
| 7,251,160 | B2 | * | 7/2007 | Li et al. | 365/185.03 |

* cited by examiner

*Primary Examiner*—Anh Phung
(74) *Attorney, Agent, or Firm*—Schwabe, Williamson & Wyatt, P.C.

(57) ABSTRACT

A method is for reducing possible errors in execution of simultaneous read and verify operations of data being modified in first and second different partitions of a memory device caused by turning on or off of a first partition's bank of sense amplifiers while a critical discrimination phase is being carried out by the second partition's bank of sense amplifiers. The method may include establishing an augmented duration of one of the read and verify operations exceeding a duration of the first partition's critical discrimination phase. The method may conditionally delay generation of a turn on or turn off signal of the first partition by a time determined by a command of termination, or by a beginning of the critical discrimination phase of the second partition when the other of the read and verify operations is in progress.

20 Claims, 5 Drawing Sheets

SYNCHRONIZATION OF OPERATIONS IN DISTINCT MEMORY PARTITIONS

FIELD OF THE INVENTION

The invention relates generally to nonvolatile memory devices with multiple partitions, and more particularly, to dual job memory devices capable of allowing the reading of data stored in a partition of the memory while a modification of data stored in a different partition of the memory device is in progress.

BACKGROUND OF THE INVENTION

In dual job FLASH memory devices, in which it is possible to read data from a partition and modify data (programming or erasing) in another partition at the same time, an important problem to be addressed is that of minimizing or reducing the effects of disturbances generated by a data modification operation on an eventually simultaneous read operation, and vice-versa. These disturbances are mainly due to current absorption injection peaks from common supply nodes (Vdd, Gnd, boosted voltages).

The problem is often circumvented by separating, where possible, the supply lines of the read circuits from those of the program/erase circuits. However, in certain circuits this design is not applicable. An important example is the turning on and off of banks of sense amplifiers of the various partitions.

Indeed, to reach a good matching between read and verify operations, the verifications of the correct execution of modifications (program or erase) of data stored in a certain partition are carried out through the same sense amplifiers that are used for reading data from the partition. This is to eliminate the error due to possible differences among single sense amplifiers. Therefore, each memory partition has its own bank of sense amplifiers that perform both read and verify operations.

The banks of sense amplifiers are powered through the same supply lines, in particular, the same ground lines, as shown in FIG. 1. Generally, critical read operations, such as page mode or burst mode read operations, are accomplished with a high read in parallel. Moreover, for achieving the required access time, the power consumption of sense amplifiers is relatively large, and thus they cannot be kept constantly powered. Therefore, a request for a read or verify operation implies turning on the bank of sense amplifiers and turning it off at the end of the read or verify operation.

For illustration purposes, let us refer to an architecture in which each bank comprises 128 sense amplifiers and suppose that two operations are in progress. That is, a read operation is in progress in a partition and the program algorithm is starting a verify routine in another partition, as shown in FIG. 2.

Turning on the bank of sense amplifiers of a partition causes a current peak toward ground of several mA that determines an increase of the potential of the ground node conductor to which the NMOS transistors of the sense amplifier are connected. This transitory effect constitutes a disturbance that may cause an evaluation error if the amplifiers of the partition being verified are turned on in the critical phase of discrimination of logic values. The problem is even more critical in multilevel memory devices in which the discrimination margins between the threshold voltage distributions are reduced.

According of a common embodiment depicted in FIG. 3, each sense amplifier is composed of a differential amplifier that compares a reference current with that of the addressed cells. In particular, the precharge voltage of the selected bit-line is obtained by a voltage VRIF that is locally generated and is referred to ground. An instantaneous fluctuation of the potential of the ground node Gnd determines a consequential variation of the reference voltage (coupled to the non-inverting input (+) of the differential amplifier) that on its turn on generates a disturbance current that is summed to that of the cell, thus potentially affecting discrimination. Similarly, even turning off a bank of sense amplifiers induces a significant disturbance on the ground potential.

The above discussed example refers to a disturbance on the ground node potential, but the same problem is present on all supply nodes. This kind of problem is usually tackled by designing with great care the ground distribution lines to the sense amplifiers to minimize resistive paths. This approach, even if useful, may be insufficient to cope with the effects of absorption peaks of large amplitude. This may be due to the simultaneous turning on of a large number of circuits, such as with banks of sense amplifiers, for instance.

It is observed that what may fault a read operation is not a fluctuation of the absolute value of the voltage referred to the ground potential, but its variation during the critical phase of discrimination of the logic value.

SUMMARY OF THE INVENTION

An object of the invention is to provide an efficient and relatively non-burdensome way of preventing a data read operation from a partition, while data is being modified in another partition of the device or vice-versa, from determining turn on or turn off a bank of sense amplifiers of a partition to occur at an instant coincident with a critical discrimination phase of the sense amplifiers of the bank of the other partition.

While preserving the maximum reading speed (minimum random access time), a method of preventing these causes of errors from occurring comprises establishing the duration of the verify operation of data being modified, in excess of the duration of the critical discrimination phase by the sense amplifiers, by a time of the same order of the duration of the critical discrimination phase for example, by doubling the duration and in withholding the generation of the turn on or turn off signal of the sense amplifiers of the bank of the partition in which a verify operation is in progress, as long as the critical discrimination phase of a data read operation in the other partition is completed.

Alternatively, it is even possible to privilege data writing verify operations by accepting that a contemporary read access to another partition be temporarily prevented from generating the turn on or turn off signal of the sense amplifiers of the respective bank of the addressed partition of the datum or data as long as the critical discrimination phase of the data being verified in the other partition has finished.

In designing the memory device, one of the embodiments may be chosen or even made selectable by programming, or it may even be possible to automatically select between the two modes by establishing certain rules and by implementing a relative logic circuit of automatic choice.

The method may be used in any device in which there is an internal "aggressor" circuit that produces absorption peaks that disturb the functioning of an internal "victim" circuit. It is possible to prevent these inevitable absorption peaks from affecting the victim circuit by enabling/disabling an output latch or bank of latches of the aggressor circuit. When the victim circuit starts executing a certain critical operation, it generates a disabling signal for the latch or bank of latches that momentarily impedes the outputs of the aggressor circuit from switching. When the critical operation terminates, it generates an enabling signal for the output latch or latches of the aggressor circuit.

In many applications, the relatively small increase of the duration of an operation cycle of the aggressor circuit that is introduced is tolerable or practically influential.

DETAILED DESCRIPTION OF THE PREFERRED EMBODIMENTS

Figure 6:
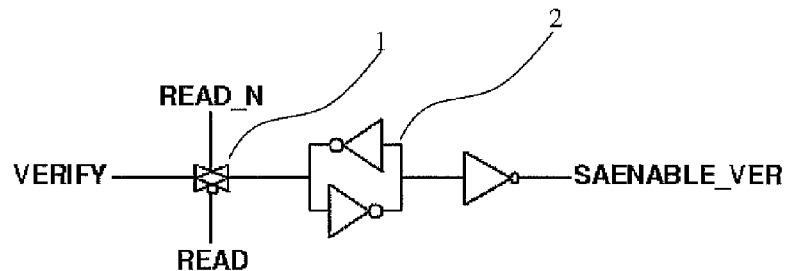
FIG. 6 depicts a possible circuit scheme for freezing the turn on and turn off command of a bank of sense amplifiers verifying data being modified in a partition, according to a pre-established choice of penalizing verification operations for preserving the design access time of random read operations.
Figure 7:
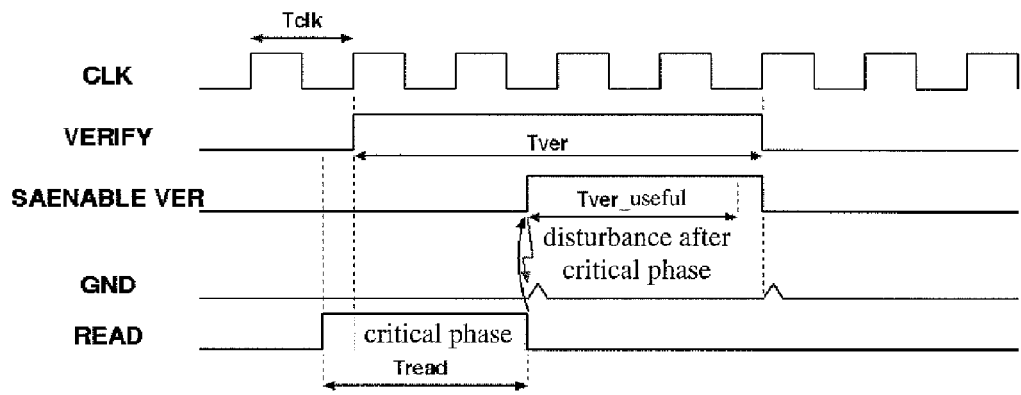
FIGS. 7 and 8 show the effectiveness of the invention in the two different situations of occurring simultaneously.
Figure 8:
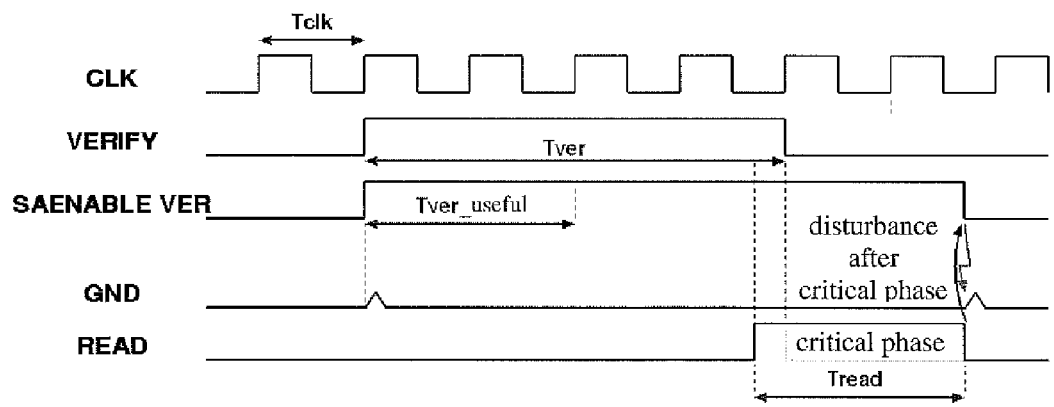

Referring to a sample embodiment of the invention that privileges a small read access time, as depicted in FIGS. 6, 7 and 8, a pass-gate 1 and a latch 2 is in the generation path of the enabling signal SAENABLE_VER (for turning on and off) for the bank of sense amplifiers of the partition. A start of a verify operation of modified data, a writing verification request (the switching high of the signal VERIFY) or an end of a verify operation (switching low of the signal VERIFY) are frozen (momentarily disabled) as will be described in detail below, are made operative after a critical phase of discrimination of data being read in another partition has terminated.

In the shown example, the disabling latch 2 may be simply controlled through the pass-gate 1 by the read command READ. Instead of a pass-gate 1 and a latch 2, any synchronization logic that produces the desired effect or even an adjustable delay circuit (for example a RC network) may be employed.

This conditional delaying is made possible by establishing a verification command VERIFY that sufficiently lasts, i.e., an execution time of a verification Tver longer than the time strictly necessary for reading the data being modified (Tver_useful). For example, it may last almost twice longer than in a typical prior art design. Such a requirement is satisfied for other reasons in the memory devices designed for a pronounced parallel read/verify.

Figure 1:
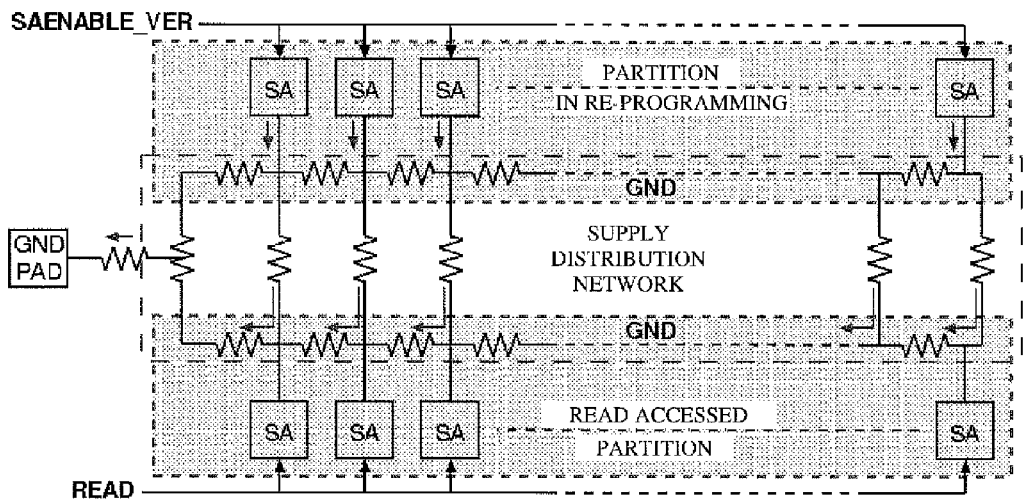
FIGS. 1, 2 and 3, as discussed above, respectively depict the supply distribution network to the banks of sense amplifiers of two distinct partitions of a memory device, the timing diagram that highlights the discussed cause of possible errors, and the scheme of a common circuit embodiment of a sense amplifier of the logic data stored in an array cell of the relative partition or sector of the memory device.
Figure 2:
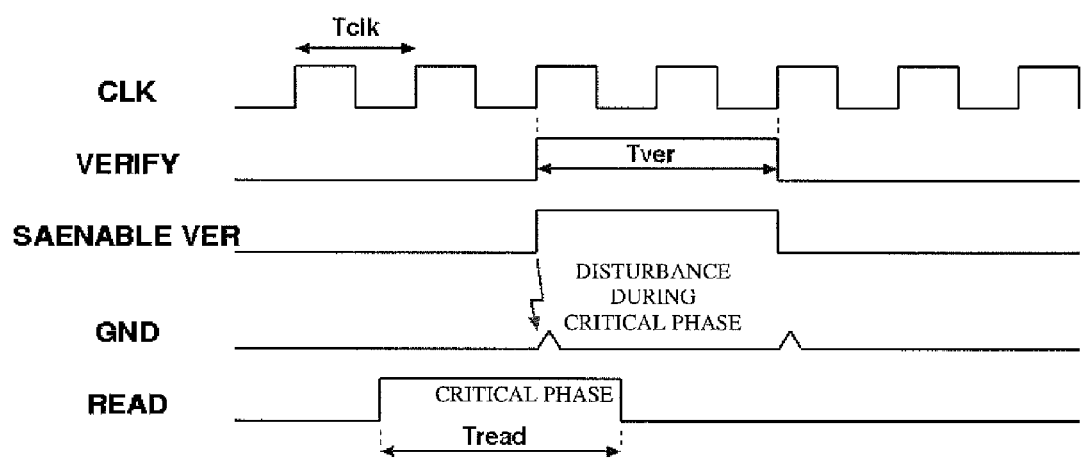
Figure 3:
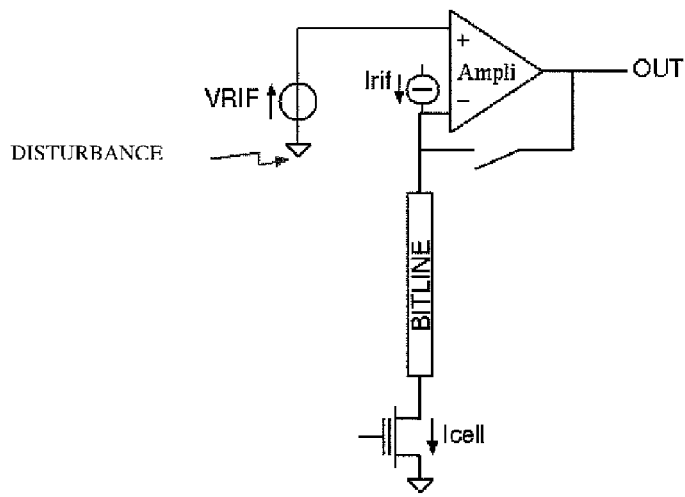
Figure 4:
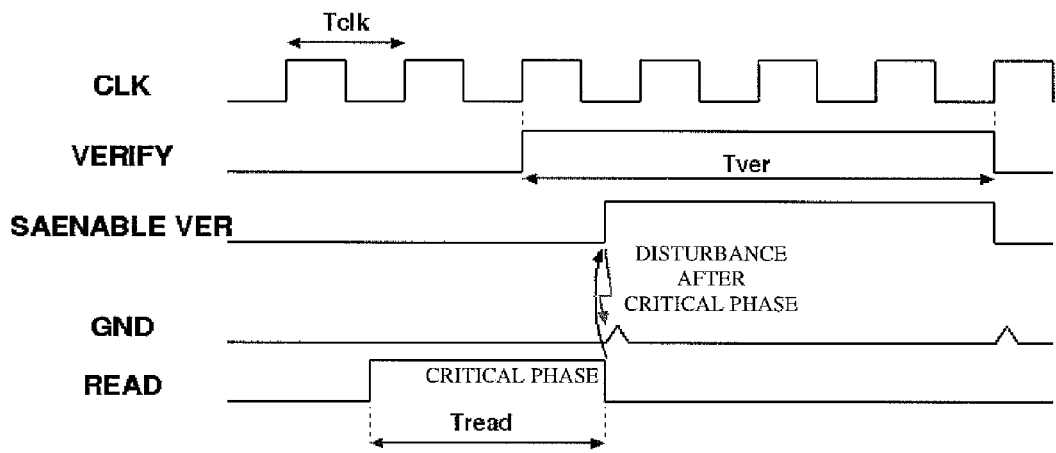
FIG. 4 depicts a sample timing diagram modified according to the invention such to ensure that no disturbance is present during a critical discrimination phase of the logic value of data read from a cell of a partition.
Figure 5:
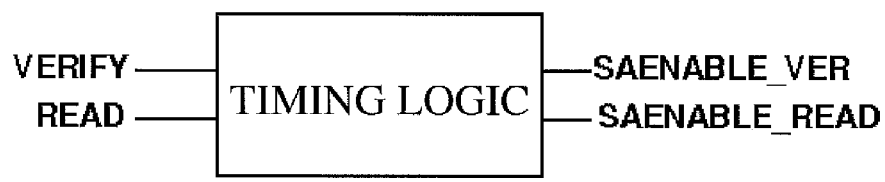
FIG. 5 is a basic diagram that depicts how the generation of turn on or turn off signals of a bank of sense amplifiers of a partition is conditioned in case of simultaneous read and verification operations in two different partitions.

For facilitating understanding, the synchronization diagrams of the sample embodiments of FIGS. 4, 7 and 8 also show the system clock signal CLK that times the various commands. The method of the invention does not rely on the presence of such a clock signal.

For example, assuming that the time needed for the verification (Tver_useful) equals two clock pulses and equals also the read time Tread (notably this condition is commonly verified at least in first approximation), it is possible to generate a signal VERIFY lasting four clock pulses such that, even in the worst case of a read operation started only a few ns before the leading edge of the signal VERIFY, the verification itself, despite the temporary freezing of the generation of the signal SAENABLE_VER that turns on the sense amplifiers of the bank of the partition in which the verification of modified data is in progress, will have a sufficient time for being completed. This event is illustrated by the timing diagram of FIG. 7.

Moreover, as illustrated by the timing diagram of FIG. 8, it is possible to delay the turning off, by a similar freezing of any switching of the signal SAENABLE_VER, of the sense amplifiers of the bank of the partition in which the verification phase of the modified data has just been finished. This may be by about 2 clock pulse cycles after the trailing edge of the command VERIFY, in the dual case of a read operation started by the command READ few ns before the trailing edge of the command VERIFY.

As stated above, the invention may even be implemented by exchanging roles, that is by conditioning the generation of the signal SAENABLE for turning on or off the sense amplifiers of the bank of the partition in which a read phase has been started by a READ command of increased duration, together with a leading or trailing edge of the command VERIFY for verifying the data being modified in a different partition. Of course, in case of a random access, this alternative embodiment implies an increased access time.

In case of a burst mode read access, if the parallel read of the device is sufficiently high, read operations may be, according to the last embodiment, temporarily delayed without sensibly penalizing the overall speed performance of the device.

Figure 9:
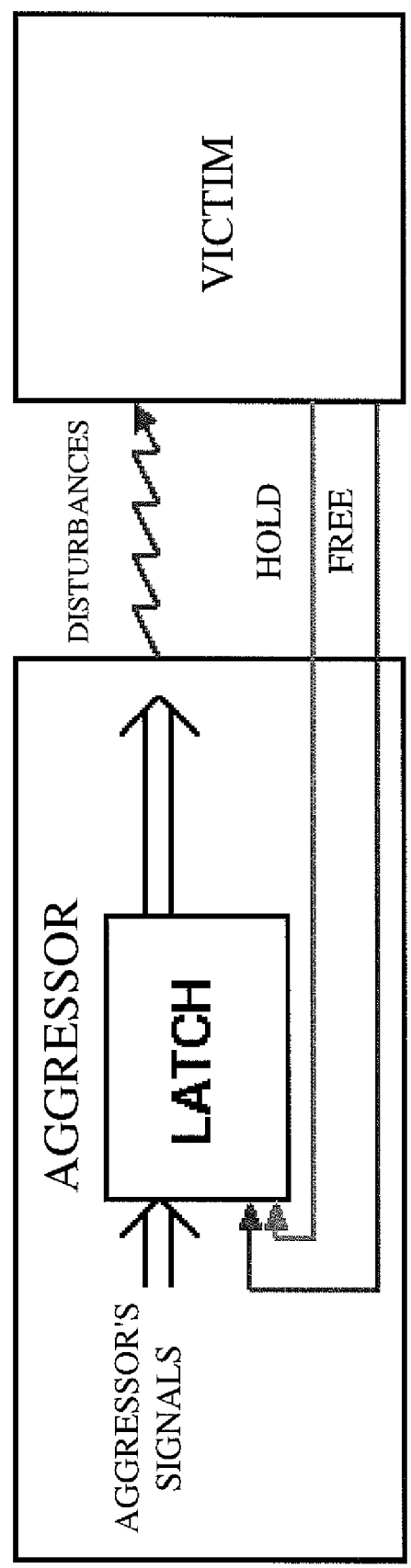
FIG. 9 depicts a basic circuit scheme according to the invention for momentarily preventing an aggressor circuit from causing a disturbance on common supply lines that may propagate to a victim circuit connected thereto and disturb its functioning.

The method of the invention has been illustrated referring to a memory device, but it may be usefully implemented in any device, such that of FIG. 9, in which there is an aggressor (first) circuit that during its working cycles causes disturbances that may propagate to a victim (second) circuit. It is possible to hold the outputs of the aggressor circuit from switching while the victim circuit is carrying out a certain critical operation by enabling/disabling output latches of the aggressor circuit (FIG. 9).

Figure 10:
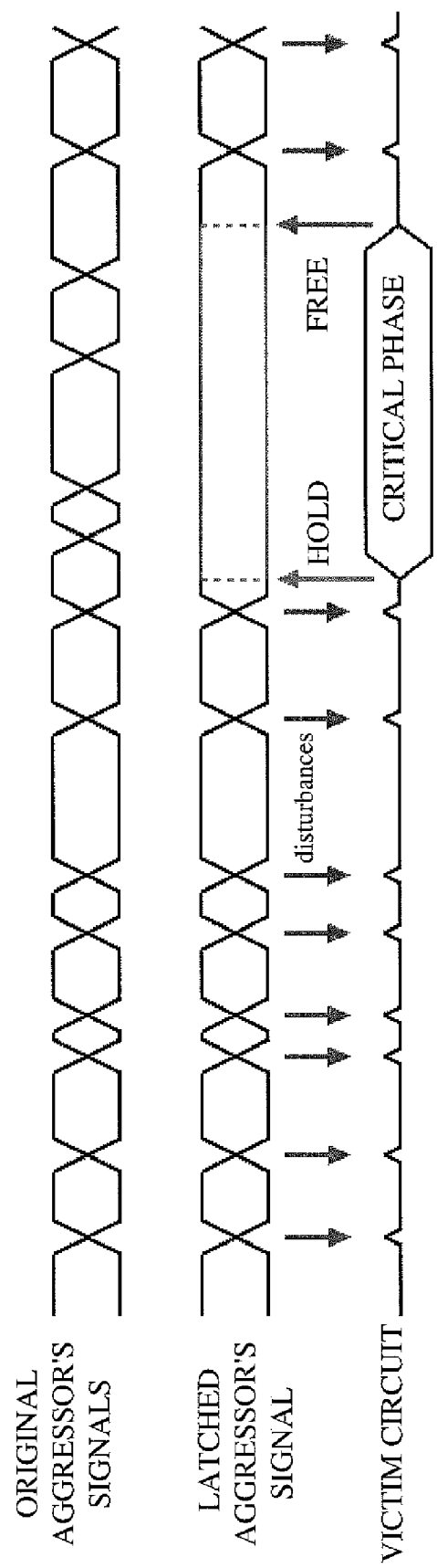
FIG. 10 depicts a time graph of the main signals of the circuit scheme of FIG. 9.

At the start of a critical operation, the victim circuit disables the output latch (or bank of latches) of the aggressor circuit by a disabling signal HOLD (FIG. 10), and then releases it by an enabling signal FREE once the critical operation is completed. As shown in the timing diagram of FIG. 10, during the critical phase the victim circuit is not disturbed by absorption peaks due to switchings of the aggressor circuit outputs.

That which is claimed:
1. A method comprising:
    establishing an augmented period that corresponds to a first operation of a first partition of a memory device, the augmented period having a duration exceeding a duration of the first operation; and conditionally delaying generation of a turn on or turn off signal of a bank of sense amplifiers of the first partition based at least in part on an occurrence of a second operation in a second partition of the memory device.

2. The method of claim 1, wherein the memory comprises a nonvolatile memory.

3. The method of claim 1, wherein the first operation is a verify operation of data being modified in the first partition, and the second operation is for a read operation of data from the second partition.

4. The method of claim 1, wherein the first operation is a read operation of data from the first partition, and the second operation is a verify operation of data being modified in the second partition.

5. The method of claim 1, wherein establishing the augmented period is based on a plurality of clock signal pulses.

6. The method of claim 3, wherein the duration of the augmented period is at least twice the duration of the first operation.

7. The method of claim 1, wherein the turn on or turn off signal is output by a generation path.

8. The method of claim 7, wherein the generation path comprises a pass-gate and a latch coupled thereto, and wherein the delay is introduced by the pass-gate and the latch.

9. The method of claim 8, wherein
said conditionally delaying is based at least in part on a command of termination corresponding to the second operation.

10. A memory device comprising:
a first memory partition comprising a bank of sense amplifiers;
a second memory partition different than said first memory partition and comprising a bank of sense amplifiers; and
a control circuit coupled to said first and second memory partitions and configured to
establish an augmented period that corresponds to a first operation of the first partition, the augmented period having a duration exceeding a duration of the first operation, and to conditionally delay generation of a turn on or turn off signal of the bank of sense amplifiers of the second memory partition based at least in part on an occurrence of a second operation in the second partition.

11. The memory device of claim 10, wherein said first and second memory partitions comprise respective first and second nonvolatile memory partitions.

12. The memory device of claim 10, wherein said control circuit establishes the augmented period based on a plurality of clock signal pulses.

13. A method comprising:
detecting a first operation in a first partition of a memory device; and
delaying a turning on or a turning off of sense amplifiers that correspond to a second operation in a second partition of the memory device based at least in part on said detecting of the first operation.

14. The method of claim 13, wherein said delaying comprises: delaying the turning on or turning off of the sense amplifiers until the first operation is completed.

15. The method of claim 13, wherein said detecting the first operation further comprises detecting a discrimination phase of the first operation and said delaying comprises delaying the turning on or turning off of the sense amplifiers based at least in part on said detecting of the discrimination phase.

16. The method of claim 13, wherein said delaying comprises:
generating a disabling signal to impede a switch of an enabling signal corresponding to the sense amplifiers.

17. A memory comprising:
a first memory partition;
a second memory partition having a bank of sense amplifiers; and
a control circuit coupled to said first and second memory partitions and configured to detect a first operation in the first memory partition and to delay a turning on or a turning off of the bank of sense amplifiers that corresponds to a second operation in the second memory partition based at least in part on the detected first operation.

18. The memory of claim 17, wherein the control circuit comprises:
a pass gate configured to receive a signal that corresponds to the first operation and to control a disabling latch to delay the turning on or the turning off of the bank of sense amplifiers based at least in part on the signal.

19. The memory of claim 17, wherein the control circuit is further configured to:
delay the turning on or turning off of the sense amplifiers until the first operation is completed.

20. The memory of claim 17, wherein the control circuit is further configured to:
detect a discrimination phase of the first operation; and
delay the turning on or turning off of the sense amplifiers based at least in part on the detected discrimination phase.

* * * * *

UNITED STATES PATENT AND TRADEMARK OFFICE
CERTIFICATE OF CORRECTION

PATENT NO. : 7,515,464 B2  Page 1 of 1
APPLICATION NO. : 11/686133
DATED : April 7, 2009
INVENTOR(S) : Daniele Vimercati et al.

It is certified that error appears in the above-identified patent and that said Letters Patent is hereby corrected as shown below:

Col. 5, line 9 "...is for a read operation..." should read --...is a read operation...--; and Col. 5, line 25, "The method of claim 8..." should read --The method of claim 1,...--

Signed and Sealed this

Fourteenth Day of July, 2009

JOHN DOLL
*Acting Director of the United States Patent and Trademark Office*